United States Patent [19]

Lach et al.

[11] Patent Number: 4,877,976

[45] Date of Patent: Oct. 31, 1989

[54] CASCADE FET LOGIC CIRCUITS

[75] Inventors: Lawrence E. Lach, Chicago; Mikiharu Ohoka, Schaumburg, both of Ill.

[73] Assignees: Gould Inc., Rolling Meadows, Ill.; Nippon Mining Co., Ltd., Japan

[21] Appl. No.: 257,897

[22] Filed: Oct. 13, 1988

Related U.S. Application Data

[63] Continuation of Ser. No. 25,899, Mar. 13, 1987, abandoned.

[51] Int. Cl.$^4$ ............................................. H03K 19/094
[52] U.S. Cl. ...................................... 307/450; 307/448
[58] Field of Search ............... 307/443, 448, 450, 574, 307/581, 303

[56] References Cited

U.S. PATENT DOCUMENTS

| | | |
|---|---|---|
| 4,177,390 | 12/1979 | Cappon . |
| 4,300,064 | 11/1981 | Eden . |
| 4,394,589 | 7/1983 | Pham et al. . |
| 4,400,636 | 8/1983 | Andrade . |
| 4,404,480 | 9/1983 | Ransom et al. . |
| 4,405,870 | 9/1983 | Eden . |
| 4,412,336 | 10/1983 | Peltier et al. . |
| 4,438,351 | 3/1984 | Schuermeyer . |
| 4,450,369 | 5/1984 | Schuermeyer . |
| 4,469,962 | 9/1984 | Snyder . |
| 4,471,238 | 9/1984 | Hickling et al. ............... 307/450 |
| 4,484,310 | 11/1984 | Everett et al. . |
| 4,485,316 | 11/1984 | Nuzillat et al. . |
| 4,490,632 | 12/1984 | Everett et al. . |
| 4,491,747 | 1/1985 | Shimizu . |
| 4,496,908 | 1/1985 | Takano et al. . |
| 4,513,398 | 4/1985 | Pham Ngu . |
| 4,514,649 | 4/1985 | Nuzillat et al. . |
| 4,518,871 | 5/1985 | Toyoda et al. . |
| 4,558,235 | 12/1985 | White et al. . |
| 4,568,843 | 2/1986 | Gloanec et al. . |
| 4,590,393 | 5/1986 | Ransom et al. . |
| 4,697,110 | 9/1987 | Masuta et al. ............... 307/443 X |

FOREIGN PATENT DOCUMENTS 0110701  6/1984  European Pat. Off. .
0226678  7/1987  European Pat. Off. .
8304352 12/1983  PCT Int'l Appl. .

OTHER PUBLICATIONS

IEEE Transactions on Electron Devices, Jun., 1980, vol. ED-27, No. 6, "Analysis of GaAs FET's for Integrated Logic", Lehovec et al.

Proceedings of the IEEE, vol. 70, No. 1, "High Speed GaAs Integrated Circuits", Jan., 1982, pp. 35–45, Long et al.

IBM Technical Disclosure Bulletin, Dec., 1986, vol. 29, No. 7, pp. 2885–2886, "Digital Driver with MESFETS Having Three Different Threshold Voltages".

IEEE Transactions on Electron Devices, vol. ED-27, No. 6, Jun., 1980, pp. 1102–1109, "Quasi-Normally-Off MESFET Logic for High-Performance GaAs IC's", Nuzillat et al.

IEEE Transactions on Microwave Theory and Techniques, vol. MTT-35, No. 3, Mar., 1987, pp. 245–259, "High-Speed Digital IC Performance Outlook", Greiling.

IEEE Journal of Solid-State Circuits, vol. SC-22, No. 6, Dec., 1987 pp. 1031–1040, "Wide-Band, Low-Noise, Matched-Impedance Amplifiers in Submicrometer MOS Technology", Toh et al.

(List continued on next page.)

*Primary Examiner*—David Hudspeth

[57]  ABSTRACT

A group III-V digital logic circuit which includes either at least two enhancement type metal semiconductor field effect transistors and one load element or two first type field effect transistors having a first threshold voltage and two second type field effect transistors having a second threshold voltage, for providing a logic operation. The second threshold voltage is less than zero and is less than the first threshold voltage. The group III-V digital logic circuit can be formed as an integrated circuit on, in particular, a GaAs substrate. The field effect transistor can be either a metal semiconductor field effect transistor or a junction field effect transistor.

25 Claims, 5 Drawing Sheets

OTHER PUBLICATIONS

Zuleeg et al., "Femtojoule High-Speed Planar GaAs E-JFET Logic", *IEEE TELD*, vol. ED-25, No. 6, Jun., 1978, pp. 628-639.

"GaAs Digital Integrated Circuit Technology", pp. 538-543 and 568-573.

IEEE Transactions of Electron Devices, vol. ED-27, No. 6, Jun. 1980, "Analysis of GaAs FET's For Integrated Logic", LeHovec et al., pp. 1074-1091.

GaAs IC Symposium, "A 0.1-4.5 GHz, 20 mW GaAs Prescaler Operating at 125° C.", Meignant et al., pp. 129-132.

1986 IEEE, Ga As IC Symposium, "GaAs MESFET 4×4 Crosspoint Switch", Anderson.

IEEE 1985 Custom Integrated Circuits Conference, "Super-Buffer FET Logic (SBFL) for GaAs Gate Arrays", Tanaka et al., pp. 425-428.

IEEE Transactions on Electron Devices, vol. ED-27, No. 6, Jun., 1980, "Quasi-Normally-Off MESFET Logic for High-Performance GaAs IC's", Nuzillat et al., pp. 1102-1109.

IEEE Proceedings of the International Conference on Computer Design, Oct. 7, 1985, "GaAs E/D BFL Circuit Technology for ECL Compatible 1.6k Gate Array", Tanaka et al.

IEEE Electron Device Letters, vol. EDL-7, No. 3, Mar. 1986, "A Simple Method to Improve the Noise Margin of III-V DCFL Digital Circuit Coupling Diode FET Logic", Yang et al., pp. 145-148.

CASCADE FET LOGIC CIRCUITS

This is a continuation of co-pending application Ser. No. 07/025,899, filed on Mar. 13, 1987, now abandoned.

BACKGROUND OF THE INVENTION

The present invention is directed to logic circuits formed from group III-V semiconductor compounds. In particular, the present invention is directed to integrated logic circuits formed from gallium arsenide (GaAs) field effect transistors (FETs), which include junction field effect transistors (J-FETs) or metal semiconductor field effect transistors (MESFETs).

The need for very high speed analog and digital logic circuits has led to the development of field effect transistors comprised of group III-V compounds, in particular gallium arsenide. In analog circuits, GaAs FETs employed are discrete or integrated components which are used in, for example, analog communications amplifiers. Small signal processing techniques are employed in these analog circuits, and the resultant devices can operate at typically 30 GHz while employing narrow band signals. With respect to digital logic circuits, attempts have been made to manufacture gallium arsenide (GaAs) digital circuits (including GaAs MESFETs, diodes, etc.) on a semi-insulating gallium arsenide wafer. GaAs digital logic circuits operate at a lower frequency than that required for analog logic circuits. Although the frequency employed in GaAs digital logic circuits is approximately one-tenth that of analog circuits, the frequency is nevertheless still very high for digital logic circuits.

GaAs digital logic circuits have been made principally for research purposes and with only limited commercialization due to a variety of technical problems. One of the problems which occurs in the manufacture of GaAs digital logic circuits is that the FETs in the circuit can have relatively large leakage currents from their gates to their source/drain paths. These large leakage currents can increase power dissipation of the logic and degrade the switching characteristics of the circuit. Also, inherent Schottky diodes are formed in GaAs devices, and these inherent Schottky diodes produce currents which are exponential functions of the relative voltages within the circuit. Thus, it is difficult to describe and predict the various voltages and operating characteristics of the circuits. In addition, a uniform ratio of Ga to As is required, but difficult to obtain since the methods for making GaAs substrates and devices have not been perfected and are not highly controllable. Therefore, many design variables and fluctuations in the circuit characteristics occur.

A number of attempts have been made to design and manufacture GaAs digital logic circuits, including integrated circuits (ICs), because they have higher speed due to their intrinsic characteristics of having a higher carrier mobility and lower power requirements. In order to provide GaAs digital logic ICs, the logic circuits developed so far have required relatively complicated circuit structures in order to have consistent operating characteristics within the IC circuit die (i.e., chip) or from die to die.

It should be noted that bipolar and metal oxide semiconductor (MOS) transistors are not typically fabricated from GaAs. That is, GaAs MOS and bipolar transistors are difficult to fabricate. With respect to fabricating MOS devices, a good insulating oxide cannot be formed on the GaAs substrate. With respect to fabricating bipolar devices, it is difficult to form heterojunctions in the GaAs substrate. Although it is possible, it is not commercially feasible. Field effect transistors (FETs) are therefore the most likely candidate for employing GaAs technology. However, unlike silicon FETs, which often isolate the gate from the channel by means of a thermally grown oxide layer, GaAs FETs must be fabricated with a metal gate layer in direct contact with either an epitaxial GaAs layer or an ion-implanted GaAs layer which is defined to include channel regions. Attempts to form insulating layers on the GaAs substrate have proven to be unsuccessful. As a result, the metal gate in the channel region of the FET forms an inherent Schottky diode which, when forward biased, conducts relatively well. The conductive Schottky diode causes many GaAs MESFET logic devices to have undesirable relatively low input impedances.

Various types of GaAs FET logic circuits have been proposed to overcome the above-mentioned problems. However, a number of the proposed circuits require three power supplies and have low integration densities because many circuit components are required in order to produce a desired logic function.

Digital GaAs logic circuits which have been proposed in the prior art belong to one of two categories, depending upon the processing technology used. An example of a logic which is typical of the first category is buffered FET logic (BFL), which employs FET technology and includes only depletion type GaAs circuits which can be manufactured using a simple process and which depend on a single depletion type transistor. The depletion transistors are relatively easy to fabricate and are faster than corresponding silicon devices. Therefore, the first families of GaAs digital logic ICs were made of all depletion type devices. These logic circuits, however, are structurally complex since they require many transistors in order to provide a functioning circuit. The disadvantages of this category of logic circuits are that significant power is dissipated in the circuits, the circuits are structurally complex and a large area is required.

An example of a logic which is typical of the second category of logic circuits is referred to as direct coupled FET logic (DCFL) and is structurally the simplest type of logic within this category. DCFL has a higher integration density and lower power consumption than that of BFL, but it is not as fast as BFL, although it is still faster than silicon devices. A basic DCFL circuit includes a load connected to an enhancement type transistor. The principal drawback to DCFL is its threshold voltage sensitivity. An additional drawback to DCFL is its temperature sensitivity. The temperature sensitivity manifests itself as both a shift in the threshold voltage and an exponential increase in Schottky current. Although the circuit switches properly when operating at room temperature, when operating at a temperature higher than room temperature, the logic circuit may not function. In addition, DCFL degrades with fan-out since when two or more DCFL circuits are connected together, an input Schottky diode at the next stage limits the high logic level and the voltage swing is compressed. Therefore, the greater the number of logic gates connected together, the higher the equivalent load and the greater the limitation of the logic high and the corresponding reduction in logic swing. In summary, DCFL operation starts degrading at temperatures slightly higher than room temperature. Further, when fan-out is increased, the circuit is not commercially feasible for most logic functions.

One approach to overcoming GaAs digital logic IC problems is disclosed in "Analysis of GaAs FETs for Integrated Logic," Lehovec et al., IEEE Transactions on Electron Devices, Volume ED-27, No. 6, June 1980, pp 1074–1091. This publication discloses a GaAs FET circuit in FIG. 19 on page 1085. The input buffer circuit shown in FIG. 19 is a type of DCFL logic and includes a first enhancement FET $Q_1$ connected in series with a first resistor R1, with the connection point therebetween connected to a gate of a second enhancement type FET $Q_2$. A second resistor R2 is connected to the drain of the second enhancement type FET $Q_2$, and a connection node is connected to an output terminal. The use of the fixed resistor R1 is conventional in the art of circuit design and $Q_1$ and R1 comprise a portion of a source follower circuit. The principal disadvantage of this type of circuit is that resistors are difficult to process and define uniformly in a GaAs manufacturing process, so that non-uniform circuit characteristics are produced. In addition, resistors tend to require either significant layout area or dissipate significant power. Since the number of components which may be fabricated on a die is limited in part by the uniformity of device characteristics, the layout requirements and the thermal dissipation of the components, the circuit in Lehovec et al. appears relatively unsuited for higher levels of integration.

In summary, there is a need in the art for a GaAs digital logic IC having a low power consumption, high integration density, and fast switching speed. There is also a need for such a logic circuit which is easy to manufacture, employs existing process technology, and is compatible with the supply voltages of standard silicon technology, specifically emitter coupled logic (ECL) technology.

SUMMARY OF THE INVENTION

It is an object of the present invention to provide a group III-V digital logic circuit having a compact layout and potentially high integration density.

It is another object of the present invention to provide a group III-V digital logic circuit having a potentially higher fan-out and higher fan-in than prior art devices, without significant power dissipation.

It is still another object of the present invention to provide a group III-V digital logic circuit having large noise margins and which is substantially insensitive to variations in the threshold voltages of the component transistors.

It is another object of the present invention to provide a group III-V digital logic circuit having simplified supply voltage requirements, such that only two power supplies are required.

It is a further object of the present invention to provide a group III-V digital logic circuit having exceptional high temperature operation.

It is another object of the present invention to provide a group III-V digital logic IC in which the inherent significant variations in the various characteristics of each of the components do not adversely affect the device to a prohibitive degree, and therefore provide a circuit which can be commercially produced.

It is still another object of the present invention to provide a group III-V digital logic IC which is compatible with the supply voltages of standard silicon technology, and in particular, the supply voltages of emitter coupled logic (ECL) circuits.

It is another object of the present invention to provide a group III-V digital logic IC having a simple, compact layout and potentially high integration density.

The above-mentioned objects are obtained by providing a first embodiment of an integrated logic circuit which includes a first field effect transistor (FET) having a gate coupled to receive an input signal, having a drain coupled to a first power source, and having a source, and a second FET having a gate coupled to the source of the first transistor, having a source coupled to a second power source, and having a drain coupled to an output terminal. In addition, a load is provided which has a first terminal coupled to the first power source and the drain of the first transistor, and a second terminal coupled to the drain of the second transistor. In preferred embodiments, the first and second FETs are enhancement mode FETs and the load is a depletion mode FET. In addition, the FETs can be metal semiconductor field effect transistors (MESFETs) or junction field effect transistors (J-FETs) formed as an integrated circuit (IC) with a group III-V substrate, in particular, a GaAs substrate.

A second embodiment of the present invention includes a first FET having a first threshold voltage, having a gate coupled to receive an input signal, having a drain coupled to a first power source, and having a source, and a second FET having a second threshold voltage, having a drain coupled to the source of the first transistor forming a connection node therebetween, having a gate, and having a source coupled to its gate and to a second power source. A third FET is provided having the first threshold voltage, having a gate coupled to a connection point of the source of the first transistor and the drain of the second transistor, having a source coupled to the second power source, and having a drain. A fourth FET is provided having the second threshold voltage, having a drain coupled to the first power source, having a gate, and having a source coupled to its gate and to the drain of the third transistor forming a connection node therebetween. An output terminal is connected to the connection node between the third and fourth FETs. Further, a fifth FET having the first threshold voltage can be provided. The fifth FET has a gate coupled to receive a second input signal, a drain coupled to the drain of the first transistor and the first power source, and a source coupled to the source of the first transistor. In preferred embodiments, the FETs can be either MESFETs or J-FETs. The first, third and fifth FETs are enhancement mode transistors and the second and fourth FETs are depletion mode transistors. All of the FETs (MESFETs or J-FETs) are formed from materials selected from group III-V semiconductors, in particular, GaAs. The logic circuit formed is a two-input NOR gate from which any type of desired logic circuit can be formed as an integrated circuit. This is accomplished by connecting various combinations of NOR gates. In order for the logic circuit to function properly, the second threshold voltage must be less than zero, and the first threshold voltage must be greater than the second threshold voltage. In addition, the difference between the first threshold voltage and the second threshold voltage is equal to a constant determined in accordance with the widths of the transistors.

These objects, together with all other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENTS

Figure 1:
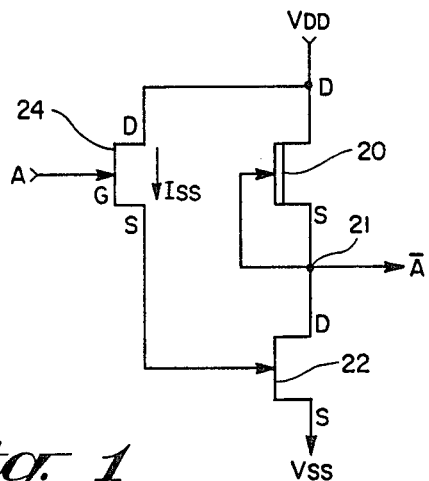
FIG. 1 is a circuit diagram of a logic inverter according to a first embodiment of the present invention.

FIG. 1 is an inverter circuit made from cascade FET logic (CFL) and includes a load 20, which is a depletion type transistor, connected in series with a main FET 22 (which is either a MESFET or a J-FET, as are all the FETs disclosed hereinafter), which is an enhancement type FET. A preferred embodiment includes MESFETs. The load 20 includes a drain connected to a power source $V_{DD}$, a gate, and a source connected to the gate. The main FET 22 includes a drain connected to the source of the load 20, a source connected to a power source $V_{SS}$ and a gate. A connection node 21 is formed between the source of the load 20 and the drain of the main FET 22. An output terminal $\overline{A}$ is connected to the connection node 21. An auxiliary FET 24, which is an enhancement type FET, has a drain coupled to the drain of the load 20 and a source coupled to the gate of the main FET 22. The auxiliary FET 24 also has a gate connected to an input terminal A. The circuit functions such that when a voltage input at the input terminal A to the gate of the auxiliary FET 24 is high, the auxiliary FET 24 conducts and a current $I_{DS}$ flows from the drain to the source of the auxiliary FET 24 into the gate of the main FET 22 to drive the main FET 22. The circuits described feature two parasitic Schottky diodes located between the gates and sources of the auixiliary FET 24 and the main FET 22. The Schottky diodes increase the input impedance of the circuit and produce a larger logic swing. The active nature of the auxiliary FET 24 further serves to increase the input impedance and increase the logic swing.

This circuit solves the DC fan-out problem which occurs in the prior art DCFL circuit. That is, in FIG. 1, when additional circuits are connected to the output terminal $\overline{A}$ so that fan-out is increased, there is less degradation of the output logic swing than with prior art circuits. In DCFL, however, if two DCFL circuits are connected together the input Schottky diode at the next stage will conduct and thereby limit the logic high level and the voltage swing. Also, the greater the fan-out, the greater the equivalent Schottky area, and the greater the limitation of the logic high and reduction of the logic swing.

In the CFL circuit of FIG. 1, when the input signal is high, the auxiliary FET 24 conducts the current $I_{DS}$ which drives the main FET 22. This action increases the input impedance of the circuit. In addition, two parasitic Schottky diodes are present—one between the gate and source of the auxiliary FET 24 and one between the gate and source of the main FET 22, as set forth above. Thus, the resultant input voltage is at a level which is twice a single Schottky voltage above ground potential, and a larger logic swing results. Since the main FET 22 is driven by $I_{DS}$ and not exclusively by the input current into the auxiliary FET 24, the circuit formed by the auxiliary FET 24 and the main FET 22 is active, thereby further increasing the input impedance at the gate of the auxiliary FET 24. The circuit in FIG. 1, therefore has a higher input impedance and less degradation of the logic swing with each fan-out circuit added since less input current is drawn by each fan-out added. The magnitude of the voltage swing of the circuit in FIG. 1 can be greater than 1.0 volt when the difference between $V_{DD}-V_{SS}$ is only 2.0 volts.

Figure 2:
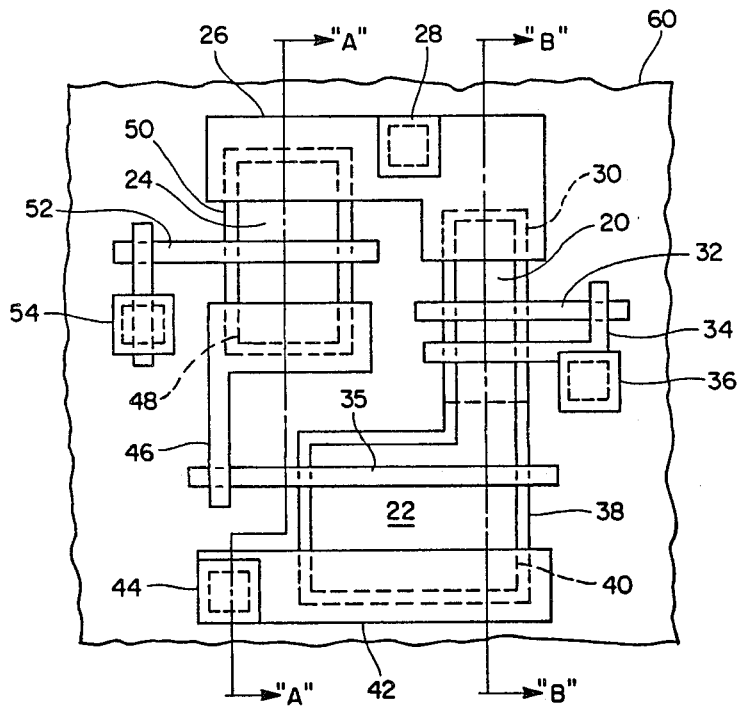
FIG. 2 is a circuit layout including the circuit in FIG. 1.
Figure 3:
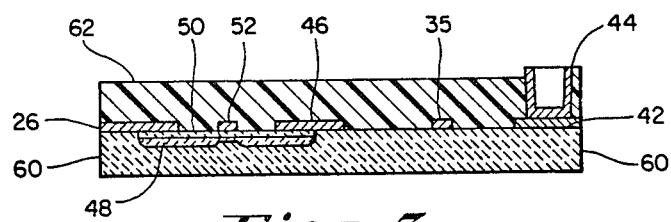
FIG. 3 is a sectional view taken along the line A—A in FIG. 2.
Figure 4:
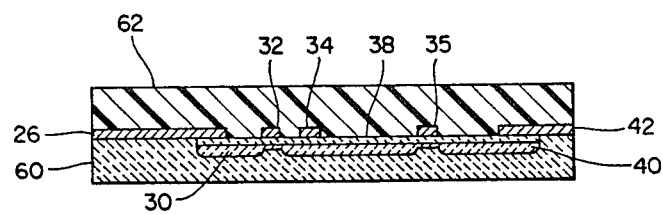
FIG. 4 is a sectional view taken along line B—B in FIG. 2.

The process by which CFL is manufactured corresponds to typical digital group III-V semiconductor processes now employed. A preferred embodiment of a layout of an IC including the circuit of FIG. 1 is formed from group III-V semiconductor MESFET technology and is shown in FIGS. 2-4. In FIG. 2, the power source $V_{DD}$ has a connection point 28 and a supply bus 26. The load 20 includes a depletion implant boundary 30, a gate 32 and a source 34. The output terminal A is shown by reference numeral 36. The main FET 22 includes a drain 34, an enhancement implant boundary 38 and a source/drain implant boundary 40. The source 42 of the main FET 22 is the same as the $V_{SS}$ supply bus. The $V_{SS}$ connection point is represented by the reference numeral 44 in FIG. 2. The auxiliary FET 24 includes a source 46, a source/drain implant region 48, an enhancement implant boundary 50 and a gate 52. The input terminal A is shown by reference numeral 54.

FIG. 3 is a cross-sectional view taken along the line A—A of FIG. 2. Like reference numerals correspond to like parts. FIG. 3 further shows a substrate 60 and an insulating layer 62. FIG. 4 is a cross-sectional view taken along the line B—B in FIG. 2. Like reference numerals correspond to like parts. In addition, FIG. 4 further shows the substrate 60 and the insulating layer 62. The substrate 60 is a group III-V compound semiconductor. In the preferred embodiment, the substrate 60 is formed of GaAs. The insulating layer 62 can be formed of any material normally employed, e.g., polyimide.

The circuit set forth in FIGS. 1-4 has enhanced operating characteristics and is compatible with processes already employed in the art, rather than requiring any special manufacturing processes.

In addition to the large logic swing and high input impedance of the circuit in FIG. 1, which allows for greater fan-out, the device also has a fast switching speed (at least 2 times better than logic circuits employing silicon technology). There is a problem, however, in that although the device is fast with respect to an output logic level transition from a 1 to a 0 logic level, when the output logic level transition is from a 0 to a 1 logic level, the main FET 22 does not respond as quickly as it does with respect to the transition from the output 1 to 0 logic level. This is because the Schottky current of the main FET 22 is not large enough to rapidly discharge the node voltage at its gate, and therefore there is a relatively slow turnoff time when the transistor is switched from an output 0 to 1 logic level. The following circuit, corresponding to the second embodiment of the invention improves this drawback of the circuit in FIG. 1.

Figure 5:
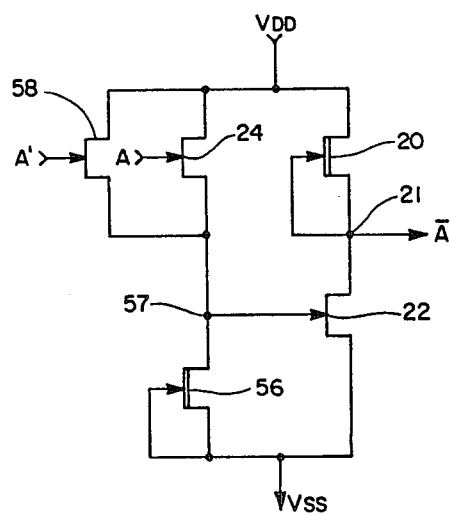
FIG. 5 is a circuit diagram of a two input-NOR circuit according to a second embodiment of the present invention.

FIG. 5 is a digital logic circuit according to the second embodiment of the present invention and represents a two-input NOR circuit. In this embodiment, an additional depletion type FET 56 having a drain connected to the connection point 57 has been added to improve the switching speed from the 0 to the 1 logic level. The source of the additional FET 56 is connected to the source of the main FET 22 and the power source $V_{SS}$. The gate of the additional FET 56 is connected to its source. This circuit also includes additional fan-in FET 58 which has a drain connected to $V_{DD}$, a source connected to the source of the auxiliary FET 24 and a gate connected to an additional input terminal A'. This circuit operates in substantially the same manner as set forth above with respect to FIG. 1 in that the output voltage is pulled down at a very fast speed when the output transition is from the 1 to the 0 logic level.

The additional depletion type FET 56 conducts, but not substantially, and therefore when the output transition is from the 0 to the 1 logic level there is an additional path in which to discharge the voltage at the gate of the main FET 22. That is, the additional depletion FET 56 discharges the node at the gate of the main FET 22 so that the output 0 to 1 logic level transition occurs much faster than that in the embodiment of FIG. 1, and both transition times (i.e., the transition time from the 1 to the 0 logic level and the transition time from the 0 to the 1 logic level) are significantly improved. The noise margin of the device is also improved over prior art DCFL logic circuits by a factor of 2 or more.

It should be noted that the circuit in FIG. 5 can be manufactured using conventional GaAs or other group III-V processing techniques. An IC layout of the circuit in FIG. 5 is shown in FIG. 6.

Figure 6:
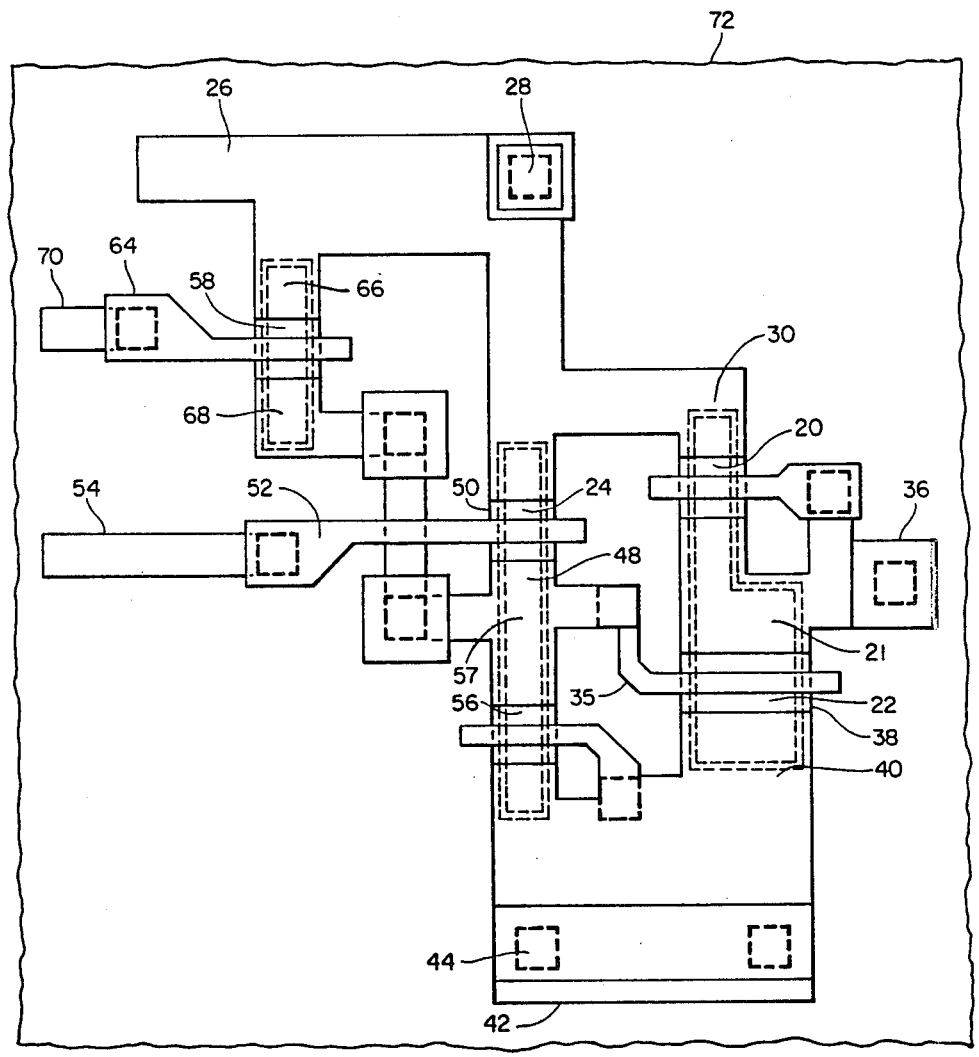
FIG. 6 is a circuit layout including the circuit in FIG. 5.

Although the layout in FIG. 6 is slightly different from FIG. 2, FIG. 6 includes the FETs 20, 22 and 24 and their corresponding regions as set forth in FIG. 2. Therefore, in FIG. 6, the reference numbers identifying these transistors and their respective regions are the same as in FIG. 2. In addition, FIG. 6 includes the additional fan-in FET 58 which has a drain 66 connected to the $V_{DD}$ supply bus 28 and a source 68 connected to the source 48 of the auxiliary FET 24. The additional input terminal A' is represented by reference number 70 and is connected to the gate 64 of the additional fan-in FET 58. The IC is formed on a substrate 72 which, in the preferred embodiment, is GaAs.

In group III-V processing technology, particularly GaAs, the devices formed have extremely non-linear characteristics. In GaAs, in the absence of a suitable insulating oxide or commercially feasible heterojunctions, Schottky MESFETs or J-FETs must be used. In GaAs technology, it is not easy to predict the operation of the circuits formed and the currents which flow, since the currents are not simple functions of applied voltages. Rather, the devices formed have inherent Schottky diodes so that the currents that flow are exponential functions of relative voltages and are difficult to describe and predict.

Adding the additional depletion type FET 56 to the circuit in FIG. 5 provides several significant surprising results. The first significant result to note is the role of the main FET 22 and the auxiliary FET 24 in establishing a high impedance node at the gate of the main FET 22.

One would expect that the additional depletion FET 56 would dissipate significantly more power and increase the power dissipation of the entire device, which is undesirable. It is well known in the prior art that a source follower (having a structure similar to the auxiliary FET 24 and the additional depletion FET 56) may be used to transform a relatively high impedance signal at one circuit node to correspond to a low impedance signal at another circuit node. Thus, the auxiliary FET 24 and the additional depletion FET 56 would appear to elevate the input impedance at the input terminal A. This could contribute to a significant overall increase in power dissipation which is undesirable. In addition, in DCFL the impedance level at the gate of the main transistor would tend to be low. To compensate for the Schottky currents which flow, an appropriate load element is provided for the main transistor. This load element must be sufficiently large so as to source the significant current of the load. However, the main transistor must then have a minimum transistor width or additional gate drive must be provided in order to provide an output 0 logic level. Either of these methods tends to increase the magnitude of the DC currents flowing in the main transistor, thereby further decreasing the impedance level at the gate and increasing power dissipation. Further, by minimizing the transistor width or providing additional gate drives, the parasitic Schottky capacitance at the gate of the main transistor is increased. This decreases the AC impedance and reduces the speed of the logic gate.

In the present invention, however, the auxiliary FET 24 and the additional depletion FET 56 provide the unexpected result that they effectively elevate the impedance level at the gate of the main FET 22 relative to the impedance level which would otherwise exist at that gate. Thus, the corresponding increase in power dissipation is not observed. Rather, the elevated impedance level at the gate of the main FET 22 is a significant factor in improving both the power dissipation and the performance of the circuit.

The impedance level at the gate of the main FET 22 is defined by the magnitude of currents which flow from this node in response to an impressed voltage. This impedance level is dominated by the Schottky diode between the gate and source of the main FET 22. The DC impedance level is dominated by the magnitude of the Schottky current which is described by a well known exponential relationship. The AC impedance level is dominated by a parasitic Schottky capacitor which is described by relatively complex and highly voltage sensitive relationships. In the second embodiment of CFL, the input impedance at the input node tends to be higher than that for DCFL due to the presence of the auxiliary FET 24 and the additional depletion FET 56. Therefore, due to the higher input impedance, the magnitude of the logic swing is not significantly degraded with fan-out and the load 20 needs to output less current. Because of the reduced current of the load 20, the main FET 22 may be slightly smaller in width or may be driven less strongly at its gate. The smaller width or reduced gate drive reduces the magnitudes of the DC currents flowing at the gate of the main FET 22, thereby increasing the associated impedance level of that node and decreasing the power dissipation. In addition, the associated parasitic capacitance at the node of the main FET 22 is decreased thereby increasing the associated AC impedance level and increasing the speed of the logic gate. Thus, in CFL, the DC and AC impedance levels at the gate of the main transistor (i.e., FET 22) are relatively high, resulting in decreased power dissipation and increased speed of the device.

Another feature of the invention is that the layout requirement for the CFL circuit in both the first and second embodiments requires transistor width sizes which are very small. For example, the width of the main FET 22 can be 5 μm, the width of the auxiliary FET 24 can be 2 μm, the width of the load 20 can be 2 μm and the width of the additional depletion type FET 56 can be 2 μm. These widths are approximately the smallest sizes one can achieve when manufacturing transistors. It should be noted that the ratio of approximately 2-2-2-5 for the widths of the FETs 56, 24, 20 and 22, respectively, provides very good circuit characteristics.

In comparison, in DCFL type logic, a typical width for a load device is 3 μm and the typical width for the main transistor is approximately 10 μm. Although CFL requires more transistors than DCFL in order to achieve the same function, the total transistor area is comparable between these two types of logic circuits with the added feature that CFL also has the above-mentioned additional advantages over other types of logic circuits including DCFL and BFL.

Another major advantage of the present invention is that CFL features a substantial immunity to variations in the threshold voltages of the devices. Because of the wafer quality of GaAs, the threshold voltages of all devices are not uniform and vary over a large range on a single wafer. Therefore, the threshold voltage for any transistor is random and cannot be controlled. In DCFL, the output voltage shifts with respect to threshold voltage shifts and the logic circuit can become inoperable.

That is, in DCFL, the sensitivity of logic to changes in threshold voltages is a major drawback since the noise margins and logic swing of DCFL devices are initially low, and therefore, slight variations in the threshold voltages which degrade noise margins and logic swing can quickly render the circuit inoperable. In CFL, however, the noise margins are better than that of, for example DCFL, by a factor of two or more and the logic swing is also larger than that of DCFL. Therefore, the circuit can tolerate larger variations in the threshold voltages. Thus, the production yield is higher than that of, for example, DCFL, because more devices can operate over a larger range of threshold voltage variations.

The higher production yield is a second significant and surprising feature of the logic. In GaAs technology, the threshold voltage of a next transistor tends to correlate or to track with transitions in the threshold voltage of a previous transistor of the same type formed adjacent thereto. Therefore, the differences between the threshold voltages of the two physically adjacent transistors of the same type tend to be small. This is true for both enhancement and depletion type transistors.

Due to this local correlation of the threshold voltages between similar adjacent transistors, one would normally expect that if the enhancement voltages increase, the voltage on the gate of the main transistor would need to be more positive to achieve a given source/drain current. If the threshold voltages of the auxiliary FET 24 tracks the threshold voltage of the main FET 22, the auxiliary FET 24 would supply less voltage to the gate of the main FET 22 than normal. Therefore, it appears that the effects of a given change in threshold voltages will be large and undesirable, and that CFL would be very sensitive to threshold voltage variations. If this were true, then the yield of the device will be low and the device will be difficult to manufacture.

When the CFL device in FIG. 5, a GaAs digital IC MESFET, was tested, however, the simulation results showed unexpectedly that CFL is relatively insensitive to threshold voltage variations. That is, the FETS 20, 22, 24 and 56 can operate within a wide range of threshold voltage variations. With respect to the depletion FETs 20 and 56, the threshold voltages can vary, for example, within a range of approximately $-1.05$ to $-0.055$ V, and for enhancement FETs 22 and 24 the threshold voltages can vary, for example, within a range of approximately $-0.15$ through $0.35$ V. Thus, CFL devices remain working even with substantial changes in the threshold voltages of the various FETs.

There is actually a band of threshold voltage ranges which extend indefinitely in the positive and negative directions along a diagonal between the X and Y axes of a threshold voltage sensitivity plot in which the following relationship applies:

$$V_{t1} - V_{t2} = \text{constant}$$

where $V_{t1}$ is a first threshold voltage of the enhancement type FETs 22 and 24 and $V_{t2}$ is the threshold voltage of the depletion type FETs 20 and 56. In addition, $V_{t1}$ must be greater than $V_{t2}$, and $V_{t2}$ must be less than zero. As long as the threshold voltages meet these requirements, the device will function. The constant is dependent upon the widths of the transistors. This also provides the surprising result that the enhancement mode FETs can actually become depletion mode FETs (i.e., they exhibit a negative threshold voltage) and the circuit will continue to function even when the threshold voltages are all negative.

This paradox between what is expected in the art and what actually happens, can be explained by conceptually grouping the transistors. If one recognizes that in group III-V process technology, threshold voltages can correlate well over an entire die (but not yet over a lot of wafers), then one may conceptually group the main FET 22 and the load 20 of one logic gate with the auxiliary FET 24 and the additional FET 56 of another logic gate in examining the overall threshold sensitivity. Under this conceptual grouping, the overall threshold sensitivities of CFL are seen to be relatively small. If the threshold voltages of the main FET 22 and auxiliary FET 24 are slightly more positive than targeted (for example, if the main FET 22 of one logic gate output delivers a more positive set of logic levels to the auxiliary FET 24 at another logic gate input at the same instant), the auxiliary FET 24 would require additional gate drive to maintain the operating point at its source. In this way, the absolute logic levels on the die may vary versus threshold variation, but the overall functional yield of the logic is nevertheless high.

Yet another property of CFL is the ability to define an additional fan-in with a single two micron size additional fan-in FET 58 (see FIG. 5) having a 2 m width. This circuit can handle between 3-8 fan-ins without additional transistor resizing modifications to the basic CFL circuit. This would not normally be expected since one would normally expect that the main FET 22 would need to be duplicated for each additional fan-in or, that in the very least, the size of the additional depletion FET 56 would need to be increased in order to obtain a functional operating point for the circuit. By not having to duplicate the main FET 22, no additional capacitance is added to the source node of the additional depletion FET 56, which would significantly increase propagation delay. Further, by not having to increase the size of the additional depletion FET 56, the impedance level at the gate of the main FET 22 is not reduced. Thus, the power dissipation of the logic gate is not increased and the performance characteristics of the device are not degraded. Still further, the small size of the additional fan-in FET 58 is highly desirable for the reason that it contributes to the high integration density of the device. The smaller the transistor the smaller the parasitic capacitance and conductance so that the high impedance level at the gates of the main FET 22 and the auxiliary FET 24 are maintained, as is the high speed and low power of the device. In addition, the present invention operates using only two power supplies, $V_{DD}$ and $V_{SS}$, and therefore is particularly compatible with emitter coupled logic (ECL) technology.

Figure 7A:
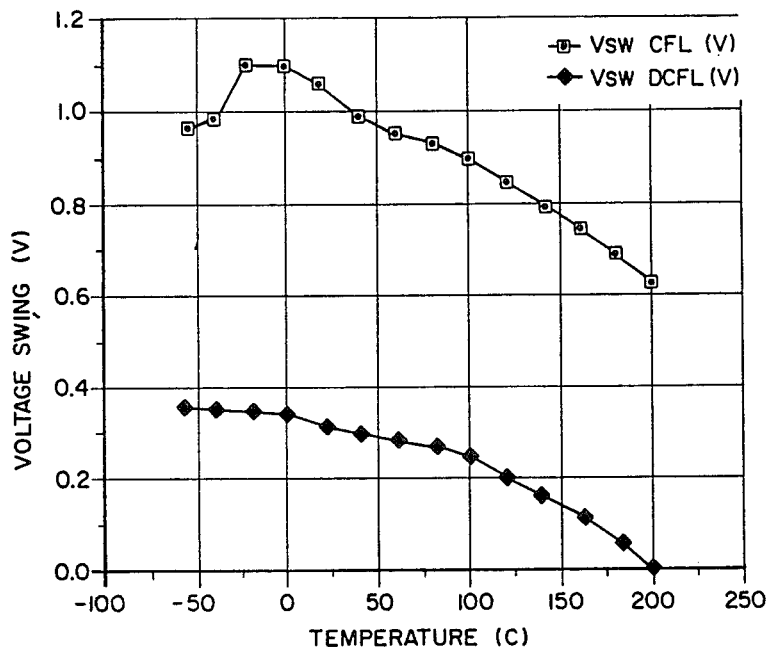
FIGS. 7A-7C are graphs of the temperature and voltage characteristics of the circuit in FIG. 5, without the additional fan-in transistor 58, compared to that of a prior art circuit.
Figure 7B:
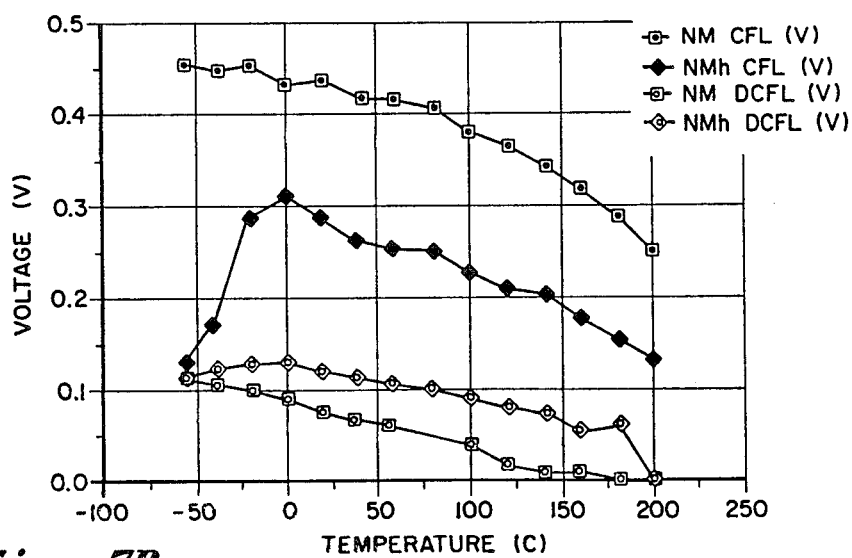
Figure 7C:
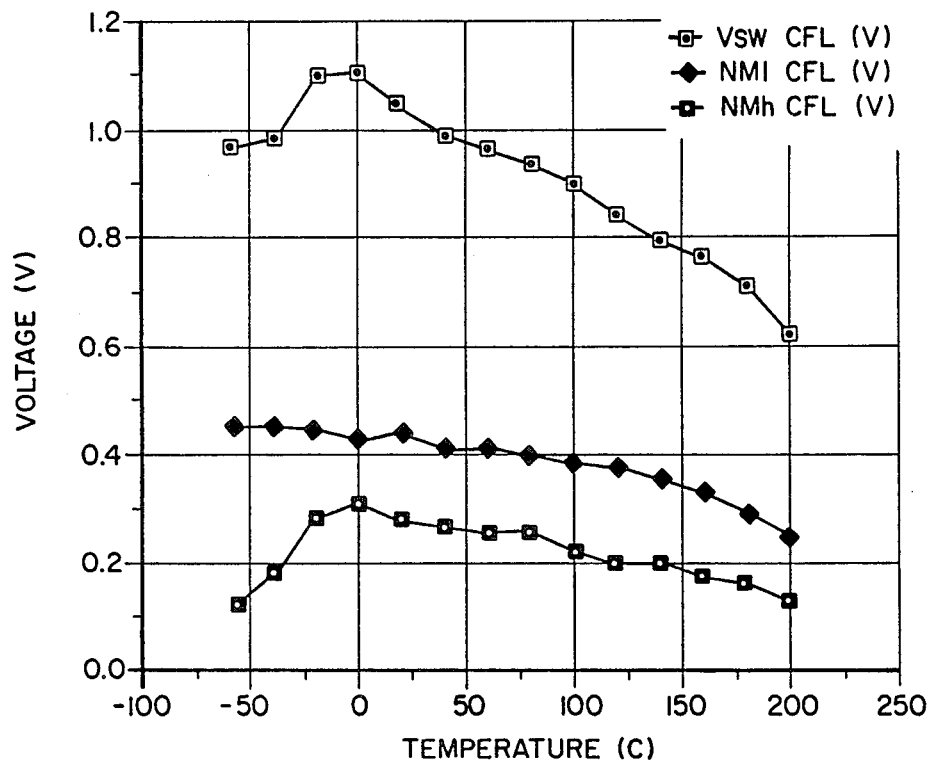

Another surprising advantage of CFL is that this logic can operate within an extremely wide temperature range, for example, between, at least, −50° C. to 200° C. FIGS. 7A to 7C compare the voltage swing and noise margin levels of DCFL and CFL inverters (i.e, the CFL inverters including the circuit in FIG. 5 without the additional fan-in FET 58) having a fan-out of three. These early prototype results reveal that DCFL does not function at 200° C. (the device stops functioning at approximately 175° C.); whereas CFL circuits continue to function at 200° with only some degradation.

TABLE 1 shows the voltage swing, high level noise margin ($NM_H$) and low level noise margin ($NM_L$) differences between CFL and DCFL at temperatures of 20° C., 100° C. and 200° C. and having a fan-out of three.

TABLE 1

| Fan-Out = 3 | 20° C. | 100° C. | 200° C. |
|---|---|---|---|
| Voltage Swing | | | |
| DCFL | .32 | .23 | .00 |
| CFL | 1.05 | .89 | .62 |
| $NM_H$ | | | |
| DCFL | .12 | .09 | .00 |
| CFL | .29 | .23 | .13 |
| $NM_L$ | | | |
| DCFL | .08 | .04 | .00 |
| CFL | .45 | .37 | .25 |

It can be seen that CFL has substantially better performance characteristics than DCFL at all temperatures. The voltage swing data is taken from the graph in FIG. 7A. FIGS. 7B and 7C are graphs comparing DCFL to CFL logic with respect to temperature and voltage. It can be seen that CFL provides a logic circuit which can be used in many instances since not only does it have high speed and low power consumption due to its large voltage swing, but it is also capable of withstanding high temperatures. Thus, CFL circuits can be used in many more applications than prior digital logic circuits.

The group III-V digital logic circuits of the present invention provide significant advantages over the prior art, including DCFL and BFL, in that they have higher integration density, lower power, and higher speed, and operate at higher temperatures. The attractiveness to commercially produce devices of this type (i.e., CFL) is also greatly enhanced since CFL operates over larger variations in threshold voltages and is compatible with supply voltages of silicon technology, particularly ECL. In addition, group III-V compound semiconductors, particularly GaAs, are inherently superior to silicon technology in areas of speed and power performance. (In general, GaAs devices are 3 to 5 times faster and dissipate power 4 to 6 times better than silicon devices.) The GaAs digital logic circuits of the present invention provide surprising results over those expected particularly with respect to threshold voltage variations and temperature. Further, they employ existing processing technology and are compatible with the supply voltage standards of silicon devices making them attractive for commercial production.

With respect to employing J-FETs in the logic circuit, it is predicted that improved circuit characteristics over those of even MESFET circuits will result. In J-FETs, a p-type implant is provided only in the portion of the substrate on which a gate is to be formed. A gate is then formed on the p-type implant. This reduces the leakage current flowing from the gate to the source and theoretically should improve the switching characteristics of the device. It is predicted that the operating temperature may also increase over that of MESFET circuits. The only drawback of J-FET technology is that it requires difficult processing techniques. Thus, in choosing between MESFET and J-FET technology there is a trade off between more difficult processing techniques and improved performance characteristics of J-FET circuits compared to less difficult processing techniques and performance characteristics (which are very good, but not quite as good as those expected from J-FET technology) of MESFET circuits.

The foregoing is considered as illustrative only of the principles of the invention. Further, since numerous modifications and changes will readily occur to those skilled in the art, it is not desired to limit the invention to the exact construction and applications shown and described, and accordingly, all suitable modifications and equivalents may be resorted to, falling within the scope of the present invention and the appended claims and their equivalents. For example, the CFL inverter circuit including the additional fan-in FET 58 which forms a two input NOR circuit can be combined with other two input NOR circuits to form any other logic circuit desired, i.e., three-input NOR gates can be produced by providing another FET in parallel with FET 56, etc. In addition, any group III-V semiconductor compound, e.g., InP, can be employed.

What is claimed is:

1. An integrated logic circuit, comprising:
   a group III-V compound semiconductor substrate;
   an input signal terminal;
   an output signal terminal;
   a first power supply node;
   a second power supply node;
   a first field effect transistor on said semiconductor substrate, having a first gate coupled to the input signal terminal, having a first drain coupled to the first power supply node, and having a first source;
   a second field effect transistor on said semiconductor substrate, having a second gate coupled to said first source of said first field effect transistor, having a second source coupled to the second power supply node, and having a second drain coupled to the output signal terminal;

a third field effect transistor of a depletion type, having a third gate, having a third source coupled to the third gate and having a third drain, wherein said first power supply node corresponds to the third drain of said third field effect transistor and the third source of the third field effect transistor is coupled to the output signal terminal; and a fourth field effect transistor having a fourth drain coupled to said first source of said first field effect transistor, having a fourth gate and having a fourth source coupled to said fourth gate and to the second power supply node.

2. An integrated logic circuit as set forth in claim 1, wherein said substrate is GaAs.

3. An integrated logic circuit as set forth in claim 1, wherein said fourth field effect transistor is a metal semiconductor field effect transistor.

4. An integrated logic circuit as set forth in claim 1, wherein said fourth field effect transistor is a junction-field effect transistor.

5. An integrated logic circuit as set forth in claim 1, wherein said logic circuit operates over a temperature range of at least −50° to 200° C.

6. An integrated logic circuit coupled to first and second power sources and having input and output signal terminals, comprising:

a group III-V compound semiconductor substrate;

a first field effect transistor on said substrate, having a first threshold voltage, having a gate coupled to the input signal terminal, having a drain coupled to the first power source, and having a source;

a second field effect transistor on said substrate, having a second threshold voltage, having a drain coupled to said source of said first transistor forming a first connection node therebetween, having a gate, and having a source coupled to said gate and to the second power source;

a third field effect transistor on said substrate, having the first threshold voltage, having a gate coupled to the first connection node, having a source coupled to the second power source, and having a drain; and a fourth field effect transistor on said substrate, having the second threshold voltage, having a drain coupled to the first power source, having a gate, and having a source coupled to said gate and to said drain of said third transistor, forming a second connection node therebetween, the output terminal coupled to the second connection node.

7. An integrated logic circuit as set forth in claim 6, wherein said first and third field effect transistors are metal semiconductor field effect transistors.

8. An integrated logic circuit as set forth in claim 6, wherein said first and third field effect transistors are junction field effect transistors.

9. An integrated logic circuit as set forth in claim 6, wherein said second and fourth field effect transistors are depletion mode transistors.

10. An integrated logic circuit as set forth in claim 9, wherein said second and fourth field effect transistors are metal semiconductor field effect transistors.

11. An integrated logic circuit as set forth in claim 9, wherein said second and fourth field effect transistors are junction field effect transistors.

12. An integrated logic circuit as set forth in claim 6, further comprising:

a second input signal terminal; and a fifth field effect transistor on said substrate, having the first threshold voltage, having a gate coupled to the second input signal terminal, having a drain coupled to said drain of said first transistor and to the first power source, and having a source coupled to said source of said first transistor.

13. An integrated logic circuit as set forth in claim 12, wherein said fifth transistor is a metal semiconductor field effect transistor.

14. An integrated logic circuit as set forth in claim 12, wherein said fifth transistor is a junction field effect transistor.

15. An integrated circuit as set forth in claim 12, wherein said substrate is GaAs.

16. An integrated logic circuit as set forth in claim 12, wherein said logic circuit is a two-input NOR circuit.

17. An integrated logic circuit as set forth in claim 16, wherein a plurality of said two-input NOR circuits are connected together to form said integrated logic circuits.

18. An integrated logic circuit as set forth in claim 12, wherein the second threshold voltage is less than zero.

19. An integrated logic circuit as set forth above with respect to claim 18, wherein said first, second, fourth and third transistors have widths having a ratio of approximately 2-2-2-5, respectively.

20. An integrated logic circuit as set forth in claim 19, wherein the width each of said first, second and fourth transistors is substantially two micrometers, and wherein the width of said third transistor is substantially five micrometers.

21. An integrated logic circuit as set forth in claim 19, wherein the first threshold voltage is greater than the second threshold voltage.

22. An integrated logic circuit as set forth in claim 21, wherein the difference between the first threshold voltage and the second threshold voltage is equal to a constant, said constant being determined in accordance with the widths of said field effect transistors.

23. An integrated logic circuit as set forth in claim 6, wherein the first and second power sources of said field effect transistors are compatible with silicon circuits.

24. An integrated logic circuit as set forth in claim 6, wherein said logic circuit includes only the first and second power sources.

25. A logic circuit, comprising:

a first potential node;

a second potential node;

a first group III-V field effect transistor having a first gate, having a first source, and having a first drain, said first gate receiving an input signal;

a second group III-V field effect transistor having a second gate, having a second source, and having a second drain, said first drain and said second drain being coupled at said first node to receive said first potential, said second gate and said second source being coupled together; and a third group III-V field effect transistor having a third source receiving said second potential, having a third drain coupled to said second source, and having a third gate coupled solely to said first source.

* * * * *